（12） United States Patent
Cao et al.

(10) Patent No.: US 11,659,867 B2
(45) Date of Patent: May 30, 2023

(54) SWITCH CONTROL CIRCUIT AND SWITCH CONTROL METHOD FOR ELECTRONIC CIGARETTE AND ELECTRONIC CIGARETTE

(71) Applicant: Shenzhen First Union Technology Co., Ltd., Shenzhen (CN)

(72) Inventors: Guangping Cao, Shenzhen (CN); Zhongli Xu, Shenzhen (CN); Yonghai Li, Shenzhen (CN)

(73) Assignee: Shenzhen First Union Technology Co., Ltd., Shenzhen (CN)

( * ) Notice: Subject to any disclaimer, the term of this patent is extended or adjusted under 35 U.S.C. 154(b) by 499 days.

(21) Appl. No.: 16/550,180

(22) Filed: Aug. 24, 2019

(65) Prior Publication Data

US 2020/0060345 A1  Feb. 27, 2020

(30) Foreign Application Priority Data

Aug. 24, 2018  (CN) .......................... 201810972375.2

(51) Int. Cl.
*A24F 47/00* (2020.01)
*A24F 40/51* (2020.01)
*H05B 1/02* (2006.01)
*H03K 17/94* (2006.01)
*A24F 40/10* (2020.01)

(52) U.S. Cl.
CPC .............. *A24F 40/51* (2020.01); *H03K 17/94* (2013.01); *H05B 1/0244* (2013.01); *A24F 40/10* (2020.01)

(58) Field of Classification Search
CPC ........ H05B 1/0244; A24F 40/10; A24F 40/51; G01F 1/68; H03K 17/94; G05B 19/042
See application file for complete search history.

(56) References Cited

U.S. PATENT DOCUMENTS

| 6,766,220 B2 * | 7/2004 | McRae | A61M 11/041 |
| | | | 128/200.14 |
| 2003/0154991 A1 * | 8/2003 | Fournier | A24D 3/17 |
| | | | 131/194 |
| 2011/0265806 A1 * | 11/2011 | Alarcon | H02J 7/0047 |
| | | | 131/273 |
| 2013/0104916 A1 * | 5/2013 | Bellinger | A61M 15/06 |
| | | | 131/328 |

(Continued)

*Primary Examiner* — Shogo Sasaki
(74) *Attorney, Agent, or Firm* — PROI Intellectual Property US; Klaus Michael Schmid

(57) ABSTRACT

A switch control circuit and method for an electronic cigarette and the electronic cigarette are disclosed, the circuit includes a sensing circuit including a first sensor, a second sensor and a heating part disposed between the first sensor and the second sensor for conveying heat to the first sensor and the second sensor; the first sensor is for detecting a first voltage generated by change of temperatures when an air flow is flowing over the first sensor; the second sensor is configured for detecting a second voltage generated by change of temperatures when the air flow is flowing over the second sensor; and a controller coupled with a sensing circuit and stores a preset voltage threshold for receiving the first voltage and the second voltage, comparing a voltage differential of the first voltage and the second voltage with the preset voltage threshold, and outputting corresponding action signals based on comparison.

7 Claims, 3 Drawing Sheets

(56) References Cited

U.S. PATENT DOCUMENTS

| | | | | |
|---|---|---|---|---|
| 2014/0014126 A1* | 1/2014 | Peleg | ............... | A24F 40/50 |
| | | | | 131/329 |
| 2014/0182609 A1* | 7/2014 | Liu | ............... | A24F 40/40 |
| | | | | 131/329 |
| 2014/0230835 A1* | 8/2014 | Saliman | ............... | A24F 40/60 |
| | | | | 131/329 |
| 2014/0258741 A1* | 9/2014 | Xiang | ............... | G06F 1/26 |
| | | | | 713/300 |
| 2014/0345635 A1* | 11/2014 | Rabinowitz | ............... | A24B 15/16 |
| | | | | 131/352 |
| 2015/0090277 A1* | 4/2015 | Xiang | ............... | A24F 40/485 |
| | | | | 131/328 |
| 2015/0173124 A1* | 6/2015 | Qiu | ............... | A24F 40/53 |
| | | | | 131/328 |
| 2016/0058074 A1* | 3/2016 | Liu | ............... | A24F 40/00 |
| | | | | 131/329 |
| 2016/0143359 A1* | 5/2016 | Xiang | ............... | A24F 40/53 |
| | | | | 392/387 |
| 2016/0366939 A1 | 12/2016 | Alarcon et al. | | |
| 2018/0020728 A1 | 1/2018 | Alarcon et al. | | |

* cited by examiner

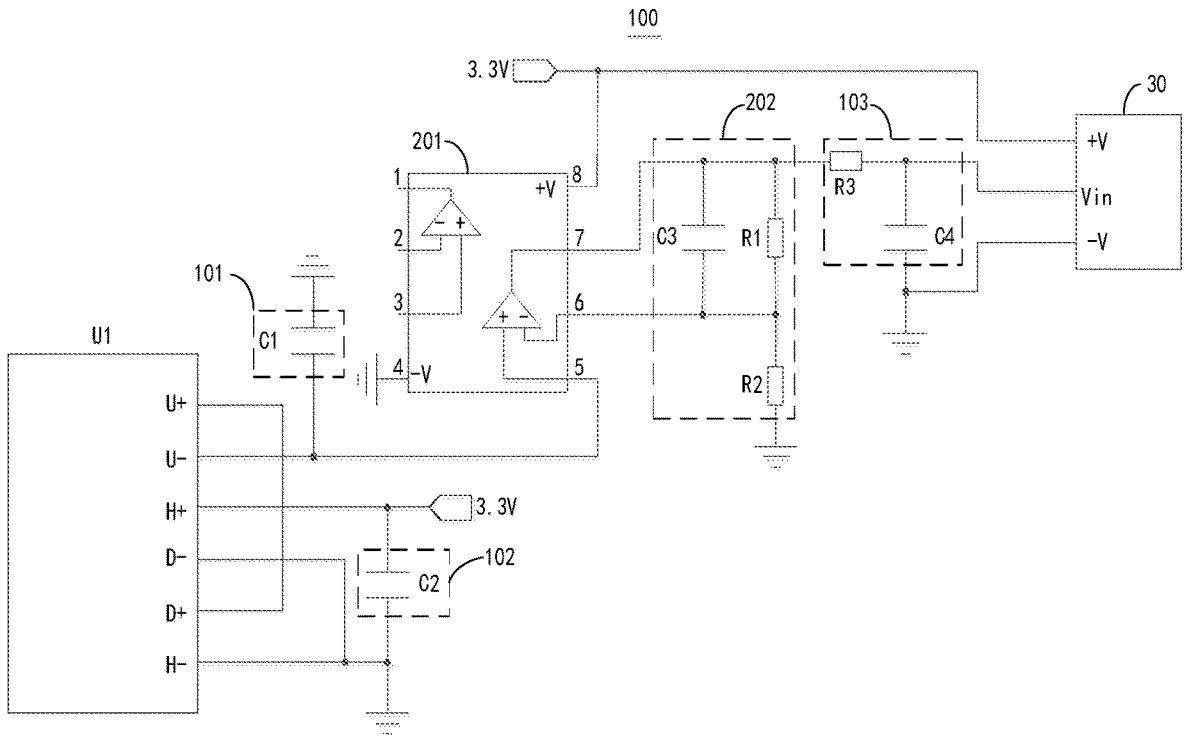

Fig. 4

| the first sensor is detecting a first voltage generated by change of temperatures when an air flow is flowing over the first sensor; the second sensor is detecting a second voltage generated by change of temperatures when the air flow is flowing over the second sensor | ~S101 |

| the controller is receiving the first voltage signal and the second voltage signal, comparing a voltage differential of the first voltage and the second voltage with the preset voltage threshold, and outputting corresponding action signals based on the comparison | ~S102 |

Fig. 5

SWITCH CONTROL CIRCUIT AND SWITCH CONTROL METHOD FOR ELECTRONIC CIGARETTE AND ELECTRONIC CIGARETTE

TECHNICAL FIELD

The present disclosure relates to the field of smoking articles, and particularly to a switch control circuit and a switch control method for an electronic cigarette and the electronic cigarette.

BACKGROUND ART

An electronic cigarette is a kind of electronic product mimicking traditional cigarettes, with a same appearance, aerosol smog, taste and feeling. By replying on application of atomization to tobacco liquid, the tobacco liquid containing nicotine is transformed into an aerosol drawn by the user. The user smoking experience is related to the amount of the aerosol smog. Three parameters relative to the amount of the aerosol smog are: a resistance of the heating wire, a ratio of vegetable glycerine in the tobacco liquid and a power of atomization, thus the above parameters are adjusted to improve the smoking experience.

Currently, the small-sized electronic cigarette in the market typically uses a microphone switch to determine the user's smoking actions, large-scale electronic cigarettes determines the user's smoking actions by a key button. The microphone switch is a capacitive switch capable of detecting a capacitance change due to the user's smoking actions, further to determine whether a smoking action is existed based on the capacitance change. When the microphone switch is adopted, it can only identify whether the smoking action is existed but can't identify how much the electric capacitance is changed, which can't reflect the true smoking process. When the key button is adopted, whether or not the electronic cigarette is initiated (i.e. whether a smoking action is existed), nor to adjust an atomizing power of the electronic cigarette, the key button is manipulated by the user, which also can't truly reflect the smoking process.

SUMMARY

To resolve the above problem, the present disclosure relates to a switch control circuit and a switch control method for an electronic cigarette and the electronic cigarette that is capable of truly reflecting the user's smoking process and improving user experience.

In order to resolve the above problem, the present disclosure provides a switch control circuit according to independent claim 1 whereas various embodiments of the switch control circuit and improvements thereto are recited therein. The circuit includes:

a sensing circuit, including a heating part, a first sensor and a second sensor, the heating part is disposed between the first sensor and the second sensor for conveying heat to the first sensor and the second sensor; the first sensor is configured for detecting a first voltage generated by change of temperatures when an air flow is flowing over the first sensor; the second sensor is configured for detecting a second voltage generated by change of temperatures when the air flow is flowing over the second sensor;

a controller, electrically coupled with a sensing circuit and configured for receiving the first voltage and the second voltage; the controller stores a preset voltage threshold and is configured for comparing a voltage differential of the first voltage and the second voltage with the preset voltage threshold, and outputting corresponding action signals based on the comparison.

Furthermore, the action signals include: when the voltage differential is greater than zero and exceeding the preset voltage threshold, outputting a first signal for initiating the electronic cigarette; and when the voltage differential is less than the preset voltage threshold, outputting a second signal for closing the electronic cigarette.

Furthermore, the voltage differential and the atomizing power have a positive correlation; if the voltage differential is greater, the atomizing power is greater; or Variances of voltage differentials, and the atomizing powers have a positive correlation; if variances of voltage differentials are greater, the atomizing power is greater.

Furthermore, the switch control circuit includes an amplifying circuit, respectively coupled with the sensing circuit and the controller; the amplifying circuit is configured for amplifying the first voltage and the second voltage and then outputting the amplified first voltage and amplified second voltage to the controller.

Furthermore, the switch control circuit includes a power supply set, respectively coupled with the sensing circuit, the amplifying circuit and the controller; the power supply set is configured for supplying power to the sensing circuit, the amplifying circuit and controller.

The power supply set includes a linear stabilizer circuit, respectively coupled with the sensing circuit, the amplifying circuit and the controller; the linear stabilizer circuit is configured for supplying voltage to the sensing circuit, the amplifying circuit and the controller.

Furthermore, the sensing circuit includes a thermocouple sensor.

Furthermore, the switch control circuit further includes:

a first filtering circuit, respectively coupled with the sensing circuit and the amplifying circuit, and configured for filtering the first voltage and the second voltage;

a second filtering circuit, respectively coupled with the sensing circuit and the linear stabilizer circuit, and configured for filtering the voltages outputted by the linear stabilizer circuit Furthermore, the amplifying circuit includes:

an operational amplifier, respectively coupled with the sensing circuit and the linear stabilizer circuit;

a voltage regulating circuit, coupled with the operational amplifier and configured for adjusting a voltage amplification factor for the operational amplifier.

Furthermore, the switch control circuit includes a third filtering circuit, the third filtering circuit is respectively coupled with the voltage regulating circuit and the controller, and configured for filtering the amplified first voltage and the amplified second voltage.

In a second aspect, the present disclosure provides a switch control method for an electronic cigarette. The switch control circuit includes a sensing circuit and a controller. The controller is coupled with the sensing circuit. The sensing circuit includes a heating part, a first sensor and a second sensor. The heating part is disposed between the first sensor and the second sensor, and configured for conveying heat to the first sensor and the second sensor. The switch control method includes:

the first sensor is configured for detecting a first voltage generated by a temperature change when an air flow is flowing over the first sensor; the second sensor is configured for detecting a second voltage generated by a temperature change when the air flow is flowing over the second sensor;

the controller is configured for receiving the first voltage signal and the second voltage signal, and comparing a voltage differential between the first voltage and the second voltage with a preset voltage threshold stored in the controller, and sending corresponding action signals based on comparing results.

Furthermore, the method further includes:

setting up a comparison chart between the voltage differentials and the atomizing powers;

obtaining the voltage differential and outputting the corresponding atomizing power based on the comparison chart.

Furthermore, the voltage differentials and the atomizing powers have a positive correlation; if the voltage differential is greater, the atomizing power outputted by the electronic cigarette is greater; or Variances of the voltage differentials, and the atomizing powers have a positive correlation; if the variance of the voltage differentials is greater, the atomizing power outputted by the electronic cigarette is greater.

In a third aspect, the present disclosure provides an electronic cigarette, including:

a shell, with an air flow path formed therein; and an aforementioned switch control circuit, disposed inside the shell, the switch control circuit includes a sensing circuit disposed in the air flow path; the sensing circuit includes a heating part, a first sensor and a second sensor; the heating part is disposed between the first sensor and the second sensor.

Compared with the prior art, the present disclosure provides a switch control circuit, applied to the electronic cigarette. By replying on the first sensor to detect a first voltage generated by a temperature change when an air flow is flowing over the first sensor and the second sensor to detect a second sensor generated by a temperature change when an air flow is flowing over the second sensor, the controller in the sensing circuit receives the first voltage and the second voltage and compares a voltage differential between the first voltage and the second voltage with the preset voltage threshold stored in the controller, the controller outputs corresponding action signals based on the comparing result. Therefore, the present disclosure may truly restore the user's smoking action, improving user experience.

BRIEF DESCRIPTION OF THE DRAWINGS

Many aspects of the present disclosure can be better understood with reference to the following drawings. The components in the drawings are not necessarily drawn to scale, the emphasis instead being placed upon clearly illustrating the principles of the present disclosure. Moreover, in the drawings, like reference numerals designate corresponding parts throughout the several views.

FIG. 4 is a circuit connection diagram of the switch control circuit according to embodiments of the present disclosure;

FIG. 5 is a flow chart of the switch control method according to embodiments of the present disclosure;

DETAILED DESCRIPTION

Provided herein are an electronically-operated aerosol-generating article (alternatively referred to as vaporization devices or electronic cigarettes etc.) generally heats a liquid aerosolizable material (i.e. tobacco liquid) containing nicotine to generate an aerosol, eventually drawn by the users.

Figure 1:
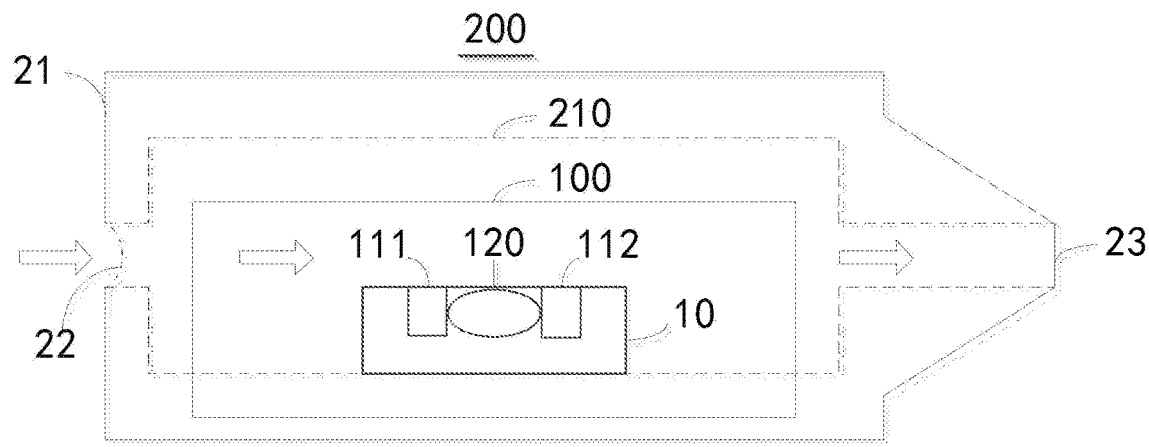
FIG. 1 is a cross-sectional view of an electronic cigarette according to an embodiment of the present disclosure.

Referring to FIG. 1, FIG. 1 is a cross-sectional view of an electronic cigarette according to an embodiment of the present disclosure. The electronic cigarette 200 includes a shell 21 and a switch control circuit 100.

The shell 21 includes an air flow path 210 formed therein. The air flow path 210 includes an air flow channel from an air inlet 22 to a mouth piece 23 at a proximal end of the electronic cigarette 200, a distal end of the electronic cigarette 200 is opposite with the proximal end. As used herein, the air inlet 22 may be bored on or near a proximal end, a middle area, a distal end or at least two thereof, for instance, the air inlets 22 are bored both on the proximal end and the distal end, when the air inlets 22 are bored on the proximal end, the air inlets 22 are round-shaped through holes symmetrically set. In some embodiments, a size of the air inlet 22 is adjustable.

The switch control circuit 100 is disposed inside the shell 21, the switch control circuit 100 includes a sensing circuit 10, disposed in the air flow path 21. The sensing circuit 10 includes a heating part 120, a first sensor 111 and a second sensor 112. The heating part 120 is disposed between the first sensor 111 and the second sensor 112.

In some embodiments, the electronic cigarette 200 includes a shell 21 (i.e. the electronic cigarette tube), an atomizer, a power supply set and a switch component. As used herein, the atomizer includes an atomizing case, an atomizing tube, a heating element and an absorbing element etc. The atomizing case includes a reservoir formed therein. The mouth piece 23 is disposed at the proximal end of the atomizer. The mouth piece 23 extends toward the reservoir to form an air tube that has a less inside diameter than the mouth piece 23. The air tube constitutes a part of the air flow path 210. One end of the air tube away from the mouth piece 23 is coupled with the atomizing tube. A sealing ring is disposed between the air tube and the atomizing tube, and configured for separating the aerosol from the tobacco liquid. The air tube may be a thin-walled metallic tube or a thin-walled plastic tube etc. The sealing ring may be a circular sealing ring and a shape of the sealing ring is determined by the shape of the atomizing tube. The sealing ring may be an elastic silicon pad etc.

Understandable, between the atomizer and the power supply set there is a connector for a physical and electrical connection, for example the connector is connected the atomizer and the power supply set via a threaded or plug-in type. Between the atomizer and the power supply set there is an air pipe constituting a part of the air flow path 210. The air pipe connects the air inlet 22 and the air tube such that the air pipe and the air tube may be in communication with external air via the air inlet 22 and the mouth piece 23. In some embodiments, a one-way valve is disposed between the atomizer and the power supply set, enabling the air in the air pipe to flow along one direction. Therefore, under a circumstance that the air inlet 22 is bored larger, the aerosolized smoking smog is prevent from spreading slowly along the air flow path 210 to cause leakage of the tobacco liquid.

Figure 2:
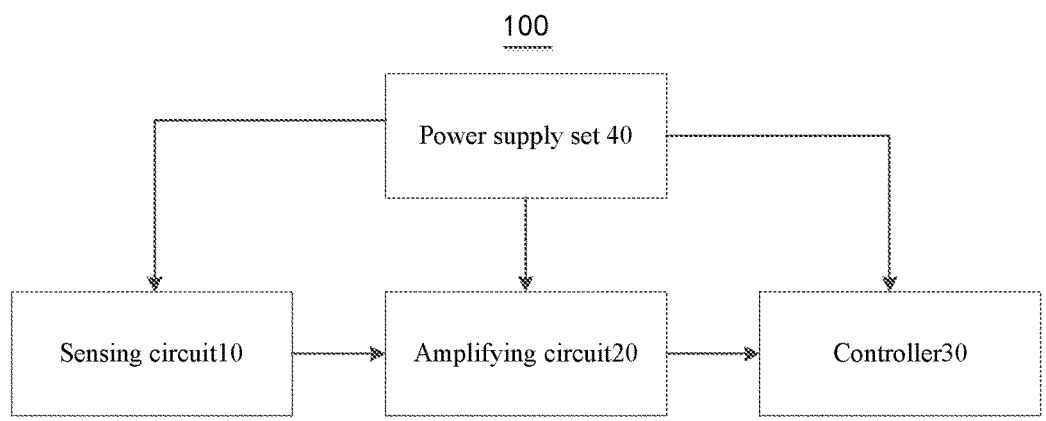
FIG. 2 is a block diagram of a switch control circuit according to an embodiment of the present disclosure.
Figure 3:
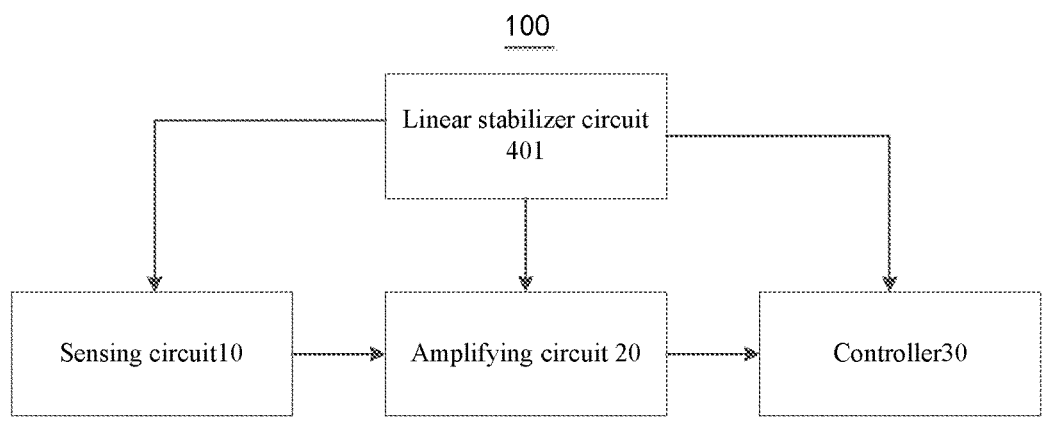
FIG. 3 is a block diagram of a switch control circuit according to another embodiment of the present disclosure.
Figure 6:
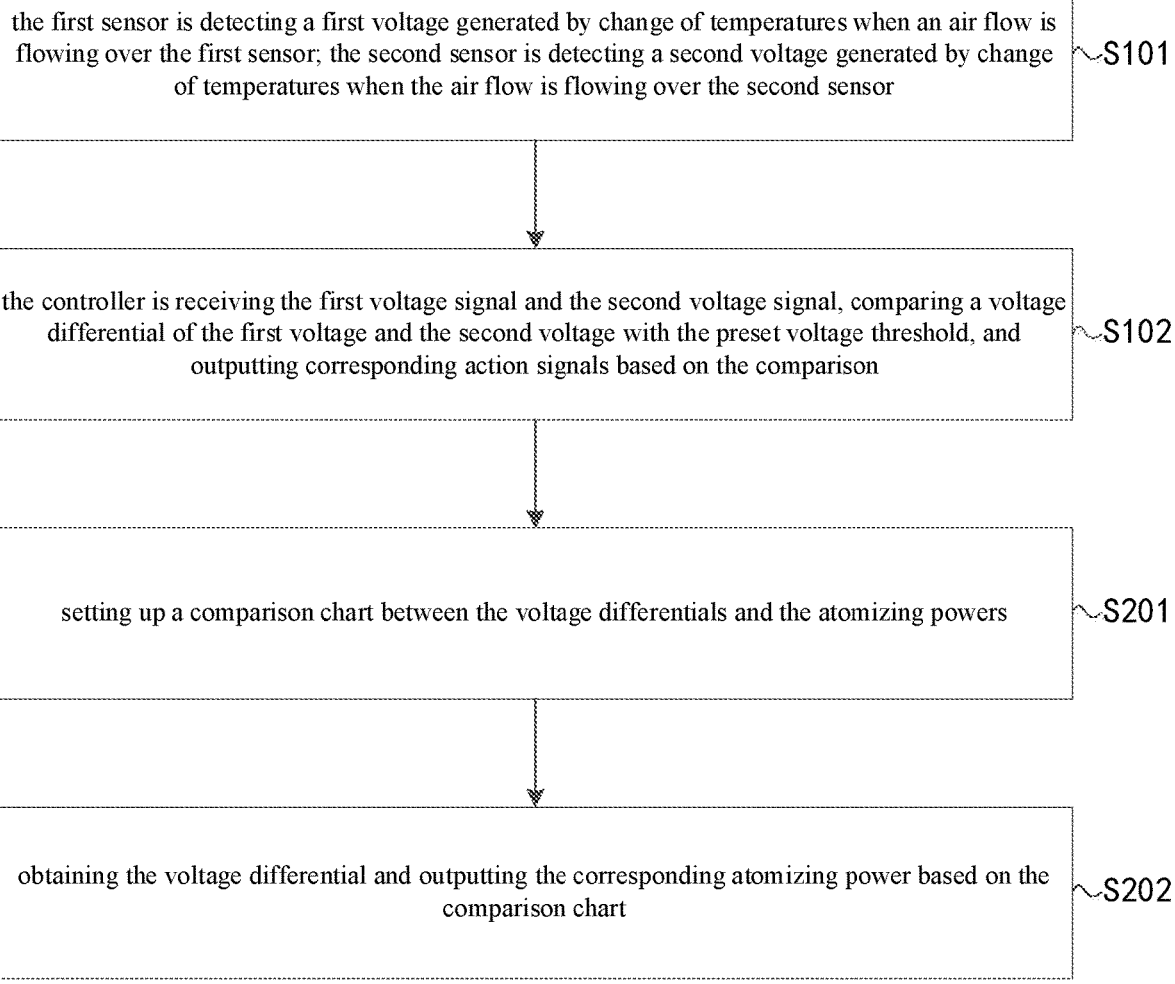
FIG. 6 is a flow chart of the switch control method according to another embodiment of the present disclosure.

Referring to FIG. 2 to FIG. 4, the switch control circuit 100 includes a sensing circuit 10, an amplifing circuit 20, a controller 30, a power supply set 40, a first filtering circuit 101, a second filtering circuit 102 and a third filtering circuit 103. Currently, the electronic cigarette 200 recognizes the smoking actions by using a microphone switch and a key button. The smoking action is an action that the user is drawing the electronic cigarette. The switch control circuit 100 may be a microphone switch or a key button, or combination thereof for determining the user's smoking action.

The sensing circuit 10 includes a heating part 120, a first sensor 111 and a second sensor 112, the heating part 120 is disposed between the first sensor 111 and the second sensor 112 and configured for conveying heat to the first sensor 111 and the second sensor 112. The first sensor 111 is configured for detecting a first voltage generated by a temperature change when an air flow is flowing over the first sensor 111. The second sensor 112 is configured for detecting a second voltage generated by a temperature change when an air flow is flowing over the second sensor 112.

The first sensor 111 and the second sensor 112 have a same working principle that a physical signal of the air flow change is transformed into a temperature signal, and the temperature signal is transformed into an electrical signal. Understandable, the air flow change when the air flow is flowing over the first sensor 111 or the second sensor 112 includes a volume and direction of the air flow changed. Under the heating by the heating part 120, the first sensor 111 gathers heat due to the air flowing while the second sensor 112 gathers heat due to the air flowing too. Meanwhile, an electrical potential difference between the first sensor 111 and the second sensor 112 is appeared, that means, a voltage difference between the first voltage and the second voltage is appeared.

In the embodiments, the sensing circuit 10 includes a thermocouple sensor. The sensing circuit 10 is mounted between the atomizer and the power supply set. When the user is drawing the electronic cigarette, the drawing action causes external air to flow into the air pipe between the atomizer and power supply set via the air inlet 22. The first sensor 111 in the air pipe is configured for detecting a first voltage generated by the temperature change of a surface of the first sensor 111; the second sensor 112 is configured for detecting a second voltage generated by the temperature change of a surface of the second sensor 112. As used herein, each of the first sensor 111 and the sensor 112 has at least one surface contacting with the air, that is the first sensor 111 and the second sensor 112 may be entirely or partly disposed in the air pipe.

Understandable, the sensing circuit 10 includes a thermocouple sensor with a comparatively high sensibility. The electrical connection points such as soldered dots etc. may be covered by protective hoods, such as protective cases to protect the thermocouple sensor, avoiding the tobacco liquid or condensed liquid etc. to coagulate upon the electrical connection points of the thermocouple sensor resulting in short-circuit etc., even triggering fires etc. In the embodiment of the present disclosure, the thermocouple sensor U1 includes a thermocouple sensor PTFD21. The heating part 120 has two pins U+ and U−, the second sensor 112 has two pins D+ and D−. The thermocouple sensor is a kind of temperature sensing elements, capable of detecting temperature directly and transforming a temperature signal into a heat electromotive force signal.

If the above first sensor 111 and the second sensor 112 have no air flowing over or have a light air flowing over, such as when the electronic cigarette 200 is off smoking, the heating part 120 conveying a constant temperature to the first sensor 111 and the second sensor 112, therefore no electromotive force signal is generated, that is, the voltage between the first sensor 111 and the second sensor 112 is 0, thus a voltage signal outputted by the pin U− is 0. When there is an air flowing over the thermocouple sensor U1, that is an air flow variation is occurred on the surface thereof, between the first sensor 111 and the second sensor 112 has a temperature differential, consequently between the pins U+ and U− of the thermocouple sensor U1 has a voltage differential, and between the pins D+ and D− has a voltage differential.

As described above, the volume and direction of the air flow affect the temperature differential between the first sensor 111 and the second sensor 112, accordingly changing the voltage differential between the first sensor 111 and the second sensor 112. If applicable, the voltage differential and the temperature differential have a functional relationship. The functional relationship of the thermocouple sensor is related to manufacturers, production types and batches, which may be looked up to datasheets of the thermocouple sensor. By detecting the voltage differential between the first sensor 111 and the second sensor 112 (i.e. the voltage differential between the pins U+ and U− of the thermocouple sensor and the voltage differential between the pins D+ and D− of the thermocouple sensor), the volume and direction of the air flow that is flowing over the thermocouple sensor.

The amplifying circuit 20 is respectively coupled with the sensing circuit 10 and the controller 30. The amplifying circuit 20 is configured for amplifying the first voltage signal and the second voltage signal, and conveying the amplified signals to the controller 30. The amplifying circuit 20 includes an operational amplifier 201 and a voltage regulator circuit 202.

The operational amplifier 201 is respectively coupled with the sensing circuit 10 and the linear stabilizer circuit 401. In the embodiments, the operational amplifier 201 uses TP1542, the operational amplifier 201 is a circuit unit with a high amplification, which may be formed in a single chip, also with a feedback unit combined to precisely amplify the first voltage and the second voltage. The amplifier 201 includes pins 1 to 8. As used herein, the pins 1, 2 and 3 are suspended, the pin 4 is a cathode pin, the pin 5 is a signal input pin, the pin 6 is a feedback pin, the pin 7 is an amplified signal pin, the pin 8 is an anode pin.

The voltage regulator circuit 202 is coupled with the operational amplifier 201 and configured for adjusting an amplification factor for voltage of the operational amplifier 201. In the embodiments, the voltage regulator circuit 202 includes an electrical resistance R1, a resistance R2 and a capacitance C3. An end of the resistance R1 is coupled with an end of the capacitance C3, an opposite end of the resistance R1 is respectively coupled with an end of the resistance R2 and the opposite end of the capacitance C3. The opposite end of the resistance R2 is grounded. One end of the capacitance C3 is coupled with the pin 7 of the operational amplifier 201, the opposite end of the capacitance C3 is coupled with the pin 6 of the operational amplifier 201. Adjusting the resistance values of resistances R1 and R2 is capable of adjusting amplification factor of the operational amplifier 201 such that the controller 30 is capable of detecting the first voltage and second voltage signals.

The controller 30 is coupled with the sensing circuit 10 and the amplifying circuit 20, and configured for receiving the first voltage and the second voltage. The controller 30 stores a preset voltage threshold and is configured for comparing the voltage differential between the first voltage and the second voltage with the voltage threshold and outputting corresponding action signals based on the comparison result. As used herein, the voltage threshold may be determined according to parameters of the electronic cigarette 200.

Specifically, the action signals includes: when the voltage differential is greater than zero and exceeding the preset voltage threshold, outputting a first signal for initiating the electronic cigarette 200; and when the voltage differential is less than the preset voltage threshold, outputting a second signal for closing the electronic cigarette 200. As used herein, the voltage differentials and the atomizing powers of the electronic cigarette 200 have a positive correlation, if the voltage differential is greater, the output atomizing power is greater. Or variances of the voltage differentials, and the atomizing powers have a positive correlation, if the variances of the voltage differentials are greater, the output atomizing power is greater.

In summary, the electronic cigarette 200 may be initiated or closed via the switch control circuit 100. Or the output atomizing power is controlled via the switch control circuit 100 to detect the user's smoking action (i.e. changes of the air flow caused by drawing the electronic cigarette 100)

For instance, when the voltage differential is greater than a preset voltage threshold, the electronic cigarette 200 has the smoking action. Taking the voltage threshold is 50 mV as an example, when the voltage differential is greater than 50 mV, it is identified that the electronic cigarette 200 has the smoking action. Or combing with the key button, continuously pressing the key button in preset times, the electronic cigarette 200 is identified to have the smoking action. As used herein, the preset voltage threshold is factory setting, however, the user may reset in a functional menus of the electronic cigarette 200, in other words, adjusting the voltage threshold based on service status of the electronic cigarette 200, which may truly imitate traditional cigarettes so as to improve the user experience. When the user is smoking traditional cigarettes, variances of volumes and directions of the air flow within the cigarette cause the volume of smoking smog are different. The present disclosure provides an electronic cigarette that real-time adjusts the atomizing power by determining variances of volumes and directions of the air flow in the electronic cigarette according to the voltage differentials or variances of voltage differentials.

Specifically, the controller 30 includes CPU (microprocessor) and MCU (single chip microcomputer) etc., a positive voltage pin V+ is coupled with the linear stabilizing circuit 401, a negative voltage pin V− is grounded. A signal input pin of the controller 30 is coupled with the third filter circuit 103.

Understandable, the power supply set includes a power supply 40, respectively coupled with the sensing circuit 10, the amplifying circuit 20 and the controller 30, and configured for supplying power to the sensing circuit 10, the amplifying circuit 20 and the controller 30. The power supply 40 includes a linear stabilizing circuit 401, respectively coupled with the sensing circuit 10, the amplifying circuit 20 and the controller 30, as an aid to supply stable power.

The first filter circuit 101 is respectively coupled with the sensing circuit 10 and the amplifying circuit 20, and configured for filtering the first voltage signals and the second voltage signals.

In the embodiments, the first filter circuit 101 includes a capacitance C1, an end thereof is grounded, an opposite end thereof is coupled with the pin U− of the thermocouple sensor U1. In terms of the thermocouple sensor, since the first sensor 111 has an equal positive voltage as the second sensor 112, that means the pin U+ has an equal voltage as the pin D+. Comparing the negative voltage differentials between the first sensor 111 and the second sensor 112, i.e. voltage differentials between the pins U+ and U−, between pins D+ and D−, of which, the pin D− is grounded. Therefore, the voltage signal outputted by the pin U− is the voltage differential of the sensing circuit 10 sensing the change of the volume and direction of the air flow.

Understandable, the first filter circuit 101 includes some filter circuits such as π-RC filter circuit or π-LC filter circuit, only need to satisfy the filtering process on the voltage signals.

The second filter circuit 102 is respectively coupled with the sensing circuit 10 and the linear stabilizing circuit 401, and configured for filtering the voltage outputted by the linear stabilizing circuit 401. The first filter circuit 101 includes a capacitance C2, one end thereof is grounded, an opposite thereof is coupled with the linear stabilizing circuit 401.

The third filter circuit 103 is respectively coupled with the voltage regulating circuit 202 and the controller 30, and configured for filtering the amplified first voltage and second voltage. The third filter circuit 103 includes a resistance R3 and a capacitance C4, an end of the resistance R3 is coupled with the resistance R1, an opposite end of the resistance R3 is coupled with the capacitance C4, an opposite end of the capacitance C4 is grounded.

The present disclosure provides a switch control circuit, a switch control method for an electronic cigarette and the electronic cigarette. By relying on the first sensor to detect the first voltage when an air flow is flowing over the first sensor to cause the temperature change on the surface, and the second sensor to detect the second voltage when an air flow is flowing over the second sensor to cause the temperature change on the surface, then the controller in the sensing circuit receiving the first and second voltages and comparing the voltage differential of the first and second voltages with the voltage threshold pre-stored in the controller, and outputting corresponding action signals based on the comparing results. Therefore, the present disclosure may truly imitate the user's smoking actions to improve the user experience. Meanwhile, it is also avoided for small-sized electronic cigarettes, the tobacco liquid, condensed tobacco liquid or smog may probably condense around the microphone switch to cause electrical malfunction, thus it can improve the safety of the electronic cigarette.

Referring to FIG. 5, which is a flow chart of the switch control method according to embodiments of the present disclosure. As shown in FIG. 5, the switch control method is applied to the switch control circuit 100 in the electronic cigarette. The switch control circuit 100 includes a sensing circuit 10 and a controller 30. The controller 30 is coupled with the sensing circuit 10. The sensing circuit 10 includes a heating part 120, a first sensor 111 and a second sensor 112; the heating part 120 is disposed between the first sensor 111 and the second sensor 112, configured for conveying heat to the first sensor 111 and the second sensor 112. The switch control method includes following steps.

Step S101: setting up a comparison chart between the voltage differentials and the atomizing powers of the electronic cigarette 200.

Preferably, the voltage differentials and the atomizing powers are in one to one correspondence relationship, of which the comparison chart is stored in the controller 30.

Step S202: obtaining the voltage differential and outputting the corresponding atomizing power based on the comparison chart.

As used herein, the voltage differentials and the atomizing powers have a positive correlation; if the voltage differential is greater, the atomizing power outputted by the electronic cigarette is greater. When the controller 30 is a MCU, in this case, the comparison chart is stored in a storage unit in the MCU, a voltage differential and an atomizing power constitute an array, and by accessing the storage unit, pointing to a head to obtain the voltage differential, then outputting a corresponding atomizing power based on the comparison chart.

Or, the switch control method further includes: setting up a comparison chart between the variances of voltage differentials and the atomizing powers of the electronic cigarette 200; obtaining the variances of voltage differentials, outputting the atomizing power based on the comparison chart. As used herein, the variances of the voltage differentials and the atomizing power have a positive correlation, if the voltage differentials are greater, the atomizing power outputted by the electronic cigarette is greater.

Understandable, variances of voltage differentials are corresponding with variances of volumes and directions of air flow in the air flow path 210, that means, variances of voltage differentials are capable of reflecting strength of the smoking action during a setting time, thus, the atomizing power outputted by the electronic cigarette 200 is controlled by variances of voltage differentials. It needs to interpret, the setting time is as short as possible, which may truly imitate the user's smoking action.

In the embodiments, variances of voltage differentials are divided according to intervals, a changing interval is corresponding to an atomizing power. For instance, when variances of voltage differentials are greater than 50 mV, less than 100 mV, the atomizing power outputted by the electronic cigarette 200 is 10 W, when variances of voltage differentials are greater than 100 mV, less than 150 mV, the atomizing power outputted by the electronic cigarette 200 is 12 W; when variances of voltage differentials are greater than or equal to 500 mV, the atomizing power is 20 W.

It is understood that the above-described embodiments are intended to illustrate rather than limit the disclosure. Variations may be made to the embodiments and methods without departing from the spirit of the disclosure. Accordingly, it is appropriate that the appended claims be construed broadly and in a manner consistent with the scope of the disclosure.

What is claimed is:

1. An electronic cigarette configured to transform a tobacco liquid into an aerosol by applying an atomizing power to the tobacco liquid, wherein the aerosol is to be drawn by a user during a smoking action, comprising:
    a shell, with an air flow path formed therein; and
    a switch control circuit disposed inside the shell, comprising:
        a sensing circuit, disposed in the air flow path; wherein the sensing circuit comprises a first sensor, a second sensor and a heating part disposed between the first sensor and the second sensor for conveying heat to the first sensor and the second sensor; the first sensor is configured for detecting a first voltage generated by change of temperatures in response to an air flow flowing over the first sensor during the smoking action; the second sensor is configured for detecting a second voltage generated by change of temperatures in response to an air flow flowing over the second sensor during the smoking action; and
        a controller, coupled with the sensing circuit and storing a preset voltage threshold; the controller is configured for receiving the first voltage signal and the second voltage signal, comparing a voltage differential of the first voltage and the second voltage with the preset voltage threshold stored in the controller, and outputting corresponding action signals based on the comparison;
        wherein in response to the voltage differential being greater than zero and exceeding the preset voltage threshold, the controller is configured to output a first action signal for initiating the electronic cigarette; and
        wherein in response to the voltage differential being less than the preset voltage threshold, the controller is configured to output a second action signal for deactivating the electronic cigarette.

2. The electronic cigarette according to claim 1, wherein the voltage differential and the atomizing power have a positive correlation,
    wherein in response to the voltage differential being greater, the atomizing power is greater; or
    wherein variances of the voltage differential, and the atomizing power have a positive correlation, wherein in response to the variance of the voltage differential being greater, the atomizing power is greater.

3. The electronic cigarette according to claim 1, wherein the switch control circuit comprises an amplifying circuit, respectively coupled with the sensing circuit and the controller; the amplifying circuit is configured for amplifying the first voltage and the second voltage and then outputting the amplified first voltage and amplified second voltage to the controller.

4. The electronic cigarette according to claim 3, wherein the switch control circuit comprises a power supply set, respectively coupled with the sensing circuit, the amplifying circuit and the controller;
    wherein the power supply set is configured for supplying power to the sensing circuit, the amplifying circuit and controller; and
    the power supply set comprises a linear stabilizer circuit, respectively coupled with the sensing circuit, the amplifying circuit and the controller; the linear stabilizer circuit is configured for supplying stable voltages to the sensing circuit, the amplifying circuit and the controller.

5. The electronic cigarette according to claim 4, wherein further comprising:
    a first filtering circuit, respectively coupled with the sensing circuit and the amplifying circuit; and the first filtering circuit is configured for filtering first voltage signals and second voltage signals;
    a second filtering circuit, respectively coupled with the sensing circuit and the linear stabilizer circuit, and the second filtering circuit is configured for filtering the voltages outputted by the linear stabilizer circuit.

6. The electronic cigarette according to claim 4, wherein the amplifying circuit comprises:
    an operational amplifier, respectively coupled with the sensing circuit and the linear stabilizer circuit;
    a voltage regulating circuit, coupled with the operational amplifier and configured for adjusting a voltage amplification factor for the operational amplifier.

7. The electronic cigarette according to claim 6, wherein the switch control circuit comprises a third filtering circuit, respectively coupled with the voltage regulating circuit and the controller; the third filtering circuit is configured for filtering the amplified first voltage signal and the amplified second voltage signal.

\* \* \* \* \*